(12) United States Patent
Currie et al.

(10) Patent No.: US 7,541,208 B2
(45) Date of Patent: Jun. 2, 2009

(54) METHODS FOR PRESERVING STRAINED SEMICONDUCTOR SUBSTRATE LAYERS DURING CMOS PROCESSING

(75) Inventors: Matthew T. Currie, Windham, NH (US); Anthony J. Lochtefeld, Somerville, MA (US)

(73) Assignee: AmberWave Systems Corporation, Salem, NH (US)

( * ) Notice: Subject to any disclaimer, the term of this patent is extended or adjusted under 35 U.S.C. 154(b) by 0 days.

(21) Appl. No.: 11/704,464

(22) Filed: Feb. 9, 2007

(65) Prior Publication Data

US 2008/0020551 A1    Jan. 24, 2008

Related U.S. Application Data

(60) Continuation of application No. 11/371,687, filed on Mar. 9, 2006, now Pat. No. 7,202,121, which is a division of application No. 10/696,994, filed on Oct. 30, 2003, now Pat. No. 7,071,014.

(60) Provisional application No. 60/422,468, filed on Oct. 30, 2002.

(51) Int. Cl.
*H01L 21/00* (2006.01)
(52) U.S. Cl. .............................. 438/46; 438/47; 438/77; 438/93; 438/94; 257/E21.085
(58) Field of Classification Search ................ 438/37, 438/46, 47, 77, 93, 94, 191, 718
See application file for complete search history.

(56) References Cited

U.S. PATENT DOCUMENTS 4,764,248 A     8/1988   Bhattacherjee et al.
4,849,368 A  *  7/1989   Yamashita et al. .......... 438/172
4,906,585 A  *  3/1990   Neppl et al. ................. 438/425

(Continued)

FOREIGN PATENT DOCUMENTS

WO          01/22482 A1     3/2001

(Continued)

OTHER PUBLICATIONS

Currie et al., "Carrier Mobilities and Process Stability of Strained Si n- and p-MOSFETs on SiGe virtual substrates," *J. Vac. Sci. Technol. B*, 19(6):2268-2279 (2001).

(Continued)

*Primary Examiner*—Hsien-ming Lee
(74) *Attorney, Agent, or Firm*—Goodwin Procter LLP

(57) ABSTRACT

Oxidation methods, which avoid consuming undesirably large amounts of surface material in Si/SiGe heterostructure-based wafers, replace various intermediate CMOS thermal oxidation steps. First, by using oxide deposition methods, arbitrarily thick oxides may be formed with little or no consumption of surface silicon. These oxides, such as screening oxide and pad oxide, are formed by deposition onto, rather than reaction with and consumption of the surface layer. Alternatively, oxide deposition is preceded by a thermal oxidation step of short duration, e.g., rapid thermal oxidation. Here, the short thermal oxidation consumes little surface Si, and the Si/oxide interface is of high quality. The oxide may then be thickened to a desired final thickness by deposition. Furthermore, the thin thermal oxide may act as a barrier layer to prevent contamination associated with subsequent oxide deposition.

31 Claims, 4 Drawing Sheets

U.S. PATENT DOCUMENTS

| | | | |
|---|---|---|---|
| 5,221,413 | A | 6/1993 | Brasen et al. |
| 5,442,205 | A | 8/1995 | Brasen et al. |
| 5,565,690 | A | 10/1996 | Theodore et al. |
| 5,726,087 | A | 3/1998 | Tseng et al. |
| 5,780,922 | A | 7/1998 | Mishra et al. |
| 6,107,653 | A | 8/2000 | Fitzgerald |
| 6,284,615 | B1 | 9/2001 | Pinto et al. |
| 6,680,496 | B1 | 1/2004 | Hammond et al. |
| 6,730,551 | B2 * | 5/2004 | Lee et al. .................. 438/191 |
| 6,831,292 | B2 | 12/2004 | Currie et al. |
| 6,838,728 | B2 | 1/2005 | Lochtefeld et al. |
| 2001/0026997 | A1 | 10/2001 | Henley et al. |
| 2002/0068393 | A1 | 6/2002 | Fitzgerald et al. |
| 2002/0171077 | A1 | 11/2002 | Chu et al. |
| 2002/0197803 | A1 | 12/2002 | Leitz et al. |
| 2003/0230233 | A1 | 12/2003 | Fitzgerald et al. |
| 2004/0031979 | A1 | 2/2004 | Lochtefeld et al. |
| 2004/0040493 | A1 | 3/2004 | Vineis et al. |
| 2004/0115916 | A1 | 6/2004 | Lochtefeld et al. |

FOREIGN PATENT DOCUMENTS

| | | |
|---|---|---|
| WO | 03/001607 A1 | 1/2003 |

OTHER PUBLICATIONS

König et al., "Needs of Low Thermal Budget Processing in SiGe Technology", *Solid State Phenomena*, vols. 47-48 (1996), pp. 17-32.

Kummer et al., "Low Energy Plasma Enhanced Chemical Vapor Deposition," *Mat. Sci. & Eng. B89*, 288-295 (2002).

Leitz et al., "Hole mobility enhancements and alloy scattering-limited mobility in tensile strained Si/SiGe surface channel metal-oxide-semiconductor field-effect transistors," *Journal of Applied Physics*, 92(7):3745-3751 (2002).

Lucovsky et al., "Low-temperature plasma-assisted oxidation of Si: a new approach for creation of device-quality Si—SiSiO$_2$ interfaces with deposited dielectrics for applications in Si MOSFET technologies," *Journal of Non-Crystalline Solids*, 179: 354-366 (1994).

Pal et al., "Gd$_2$O$_3$, Ga$_2$O$_3$ (Gd$_2$O$_3$), Y$_2$O$_3$, and Ga$_2$O$_3$, as high-κ gate dielectrics on SiGe: A comparative study," *Journal of Applied Physics*, 90(8): 4103-4107 (2001).

Sugii et al., "Role of Si$_{1-x}$Ge$_x$ buffer layer on mobility enhancement in a strained-Si *n*-channel metal-oxide-semiconductor field effect transistor," *Applied Physics Letters*, 75(19):2948-2950 (1999).

Wolf Ph.D., Stanley and Richard N. Tauber Ph.D. in Silicon Processing for the VLSI Era, vol. 1: Process Technology, Lattice Press (1986) 99. 182-3, 307-8.

Wolf Ph.D., Stanley and Richard N. Tauber Ph.D. in Silicon Processing for the VLSI Era, vol. 1: Process Technology, Lattice Press (1986) pp. 323-325.

Invitation to Pay Additional Fees for International Application No. PCT/US03/34576 mailed on Dec. 17, 2004, 7 pages.

Examination Report by the European Patent Office mailed May 23, 2007, 11 pages.

Examination Report for European Patent Application No. 03 816 979.3-1528 (Sep. 21, 2007).

* cited by examiner

METHODS FOR PRESERVING STRAINED SEMICONDUCTOR SUBSTRATE LAYERS DURING CMOS PROCESSING

CROSS-REFERENCE TO RELATED APPLICATION

This application is a continuation application of U.S. patent application Ser. No. 11/371,687, filed Mar. 9, 2006, now U.S. Pat. No. 7,202,121, which is a divisional application of U.S. patent application Ser. No. 10/696,994, filed Oct. 30, 2003, now U.S. Pat. No. 7,071,014, which claims the benefit of and priority to U.S. Provisional Application Ser. No. 60/422,468, filed on Oct. 30, 2002, the disclosure of each application being incorporated herein by reference.

FIELD OF THE INVENTION

This invention relates generally to semiconductor substrates and specifically to formation of dielectric layers on semiconductor substrates.

BACKGROUND OF THE INVENTION

The increasing operating speeds and computing power of microelectronic devices have recently given rise to the need for an increase in the complexity and functionality of the semiconductor structures that are used as the starting substrates in these microelectronic devices. Such "virtual substrates" based on silicon and germanium provide a platform for new generations of very large scale integration ("VLSI") devices that exhibit enhanced performance when compared to devices fabricated on bulk Si substrates. Specifically, new technological advances enable formation of heterostructures using silicon-germanium alloys (hereinafter referred to as "SiGe" or "$Si_{1-x}Ge_x$") to further increase performance of the semiconductor devices by changing the atomic structure of Si to increase electron and hole mobility.

The important component of a SiGe virtual substrate is a layer of SiGe heterostructure that has been relaxed to its equilibrium lattice constant (i.e., one that is larger than that of Si). This relaxed SiGe layer can be directly applied to a Si substrate (e.g., by wafer bonding or direct epitaxy), or atop a relaxed graded SiGe buffer layer in which the lattice constant of the SiGe material has been increased gradually over the thickness of the layer. The SiGe virtual substrate may also incorporate buried insulating layers, in the manner of a silicon-on-insulator (SOI) wafer. To fabricate high-performance devices on these platforms, thin strained layers of semiconductors, such as Si, Ge, or SiGe, are grown on the relaxed SiGe virtual substrates. The resulting biaxial tensile or compressive strain alters the carrier mobilities in the layers, enabling the fabrication of high-speed and/or low-power-consumption devices. The percentage of Ge in SiGe and the method of deposition can have a dramatic effect on the characteristics of the strained Si layer. U.S. Pat. No. 5,442,205, "Semiconductor Heterostructure Devices with Strained Semiconductor Layers," incorporated herein by reference, describes one such method of producing a strained Si device structure.

An approach to epitaxially growing a relaxed SiGe layer on bulk Si is discussed in International Application Publication No. WO 01/22482, entitled "Method of Producing Relaxed Silicon Germanium Layers" and incorporated herein by reference. The method includes providing a monocrystalline Si substrate, and then epitaxially growing a graded $Si_{1-x}Ge_x$ layer with increasing Ge concentration at a gradient of less than 25% Ge per micrometer to a final Ge composition in the range of $0.1<x<1$, using a source gas of $Ge_xH_yCl_z$ for the Ge component, on the Si substrate at a temperature in excess of 850° C., and then epitaxially growing a semiconductor material on the graded layer.

Another method of epitaxially growing a relaxed SiGe layer on bulk Si is discussed in a paper entitled, "Low Energy plasma enhanced chemical vapor deposition," by M. Kummer et al. (*Mat. Sci. & Eng.* B89, 2002, pp. 288-95) and incorporated herein by reference, in which a method of low-energy plasma-enhanced chemical vapor deposition (LEPECVD) is disclosed. This method allows the formation of a SiGe layer on bulk Si at high growth rates (0.6 μm per minute) and low temperatures (500-750° C.).

To grow a high-quality, thin, epitaxial strained Si layer on a graded SiGe layer, the SiGe layer is, preferably, planarized or smoothed to reduce the surface toughness in the final strained Si substrate. Current methods of chemical mechanical polishing ("CMP") are typically used to decrease roughness and improve the planarity of surfaces in semiconductor fabrication processes. U.S. Pat. No. 6,107,653, "Controlling Threading Dislocations in Ge on Si Using Graded GeSi Layers and Planarization," incorporated herein by reference, describes how planarization can be used to improve the quality of SiGe graded layers.

One technique suitable for fabricating strained Si wafers can include the following steps:

1. Providing a silicon substrate that has been edge-polished;
2. Epitaxially depositing a relaxed graded SiGe buffer layer to a final Ge composition on the silicon substrate;
3. Epitaxally depositing a relaxed $Si_{1-x}Ge_x$ cap layer having a constant composition on the graded SiGe buffer layer;
4. Planarizing or smoothing the $Si_{1-x}Ge_x$ cap layer and/or the relaxed graded SiGe buffer layer by, e.g., CMP;
5. Epitaxially depositing a relaxed $Si_{1-x}Ge_x$ regrowth layer having a constant composition on the planarized surface of the $Si_{1-x}Ge_x$ cap layer; and
6. Epitaxially depositing a strained silicon layer on the $Si_{1-x}Ge_x$ regrowth layer.

By introducing strain gradually over a series of low lattice mismatch interfaces, compositionally graded layers, as recited in step 2 above, offer a viable route toward integration of heavily lattice-mismatched monocrystalline semiconductor layers on a common substrate, offering a route towards increased functionality through monolithic integration. Utilizing both strain and bandgap engineering, modulation-doped FETs (MODFETs) and metal-oxide-semiconductor FETs (MOSFETs) may be tailored for enhanced-performance analog or digital applications. However, because these devices are fabricated on Si/SiGe virtual substrates rather than on the Si substrates commonly utilized for complementary MOS (CMOS) technologies, they present new processing challenges.

For example, because thin, near-surface, strained heteroepitaxial layers constitute critical parts of devices formed on relaxed SiGe virtual substrates the processing windows for such structures are limited. Specifically, it is desirable to avoid the consumption of these near-surface strained layers during processing. Traditional silicon-based CMOS process flows, therefore, may not be suitable for these layers because conventional CMOS processes typically result in the consumption of a large portion of surface substrate material. This consumption is primarily due to thermal oxidation steps. For example, thin thermally grown oxides are commonly used as screening layers (also called "passivation layers") during ion implantation steps. These passivation layers also serve to discourage out-diffusion of dopants during subsequent thermal anneals. Also, thermally grown pad oxides are used as a stress-mediating underlayer beneath a silicon nitride trench mask layer for shallow trench isolation (STI formation. These thermal oxidation steps, however, typically remove a total of several hundred angstroms (Å) of surface Si material. Accordingly, thermal oxidation is not desirable when processing wafers that incorporate thin surface layers formed on SiGe virtual substrates, where a final minimum thickness of 50 Å of the thin strained layer (from a starting thickness of, e.g., 50-200 Å) needs to be available for device channels.

Thus, there is a need in the art for method for forming a semiconductor structure that minimizes consumption of the material proximate to the top surface of the substrate.

SUMMARY OF THE INVENTION

Accordingly, it is an object of the present invention to provide a method for forming a semiconductor structure having a strained semiconductor layer that overcomes the limitations of known methods. Specifically, in various embodiments of the invention, methods of providing dielectric layers, such as, for example, oxide layers, which avoid consuming unacceptably large amounts of the surface material in Si/SiGe heterostructure-based wafers are proposed to replace or supplement various intermediate CMOS thermal oxidation steps known in the art. First, by using oxide deposition methods such as chemical vapor deposition (CVD), arbitrarily thick dielectric layers may be formed with little or no consumption of surface silicon. These layers, for example, oxide layers, such as a screening oxide and pad oxide layers, are formed by deposition onto, rather than reaction with and consumption of the surface layer. Alternatively, oxide deposition is preceded by a thermal oxidation step of short duration, e.g., rapid thermal oxidation. Here, the short thermal oxidation consumes little surface Si, and the Si/oxide interface is of high quality. The oxide may then be thickened to a desired final thickness by deposition. Furthermore, the thin thermal oxide may act as a barrier layer to prevent contamination associated with subsequent oxide deposition.

In general, in one aspect, a method for forming a semiconductor structure includes forming a strained semiconductor layer over a substrate and depositing a screening layer over at least a portion of a top surface of the strained semiconductor layer. In various embodiments of the invention, the thickness of the strained semiconductor is substantially unchanged following the deposition of the screening layer. In one embodiment, the strained semiconductor layer is tensilely strained, and includes, for example, a tensilely strained silicon or tensilely strained silicon-germanium alloy. In another embodiment, the strained semiconductor layer is compressively strained, and includes, for example, compressively strained germanium or compressively strained silicon-germanium alloy. The strained layer may have a thickness ranging from about 50 Å to about 1000 Å, for example, not exceeding about 300 Å. In a particular embodiment, the thickness of the strained layer does not exceed about 200 Å.

The substrate may include at least one of silicon and germanium. In one embodiment, the substrate includes an insulating layer disposed underneath the strained semiconductor layer. In another embodiment, the substrate includes a relaxed semiconductor layer disposed underneath the strained semiconductor layer. In various versions of this embodiment, the substrate further includes a compositionally graded layer disposed underneath the relaxed semiconductor layer. The graded layer may include at least one of a group II, a group III, a group IV, a group V, and a group VI element, for example, at least one of silicon and germanium. The graded layer can be graded to a concentration of greater than about 10% germanium and may have thickness ranging from about 0.5 μm to about 10.0 μm.

The step of depositing the screening layer may include chemical vapor deposition. In one embodiment, the screening layer includes an oxide layer, for example, selected from the group consisting of silicon dioxide, silicon oxynitride, silicon germanium oxide, or germanium oxide. The screening layer may have thickness ranging from about 20 Å to about 300 Å.

In various embodiments, the method further includes introducing dopants into the semiconductor structure, wherein the screening layer affects the introduction of dopants into at least a portion of the structure by at least one of scattering dopants and reducing energy of the dopants. The method may also include subjecting the structure to a thermal anneal, wherein the screening layer hinders out-diffusion of the dopants from at least a portion of the substrate.

In one embodiment, prior to depositing a screening layer, an oxide layer is grown over the portion of the top surface of the strained semiconductor layer by, for example, a rapid thermal oxidation. Thickness of the oxide layer may range from about 5 Å to about 30 Å.

In general, in another aspect, a method for forming a structure includes forming a strained semiconductor layer over a substrate, depositing a pad oxide layer over at least a portion of a top surface of the strained semiconductor layer; and forming a masking layer over the pad oxide layer. The pad oxide layer substantially inhibits formation of stress-induced defects in the strained semiconductor layer. The masking layer may include silicon nitride.

In one embodiment, prior to depositing a pad oxide layer, an oxide layer is grown over the portion of the top surface of the strained semiconductor layer, for example, by a rapid thermal oxidation. The thickness of the oxide layer may range from about 5 Å to about 30 Å.

In various embodiments of this aspect of the invention, the substrate includes at least one of silicon and germanium. In one embodiment, the substrate includes an insulating layer disposed underneath the strained semiconductor layer. In another embodiment, the substrate includes a relaxed semiconductor layer disposed underneath the strained semiconductor layer. In various versions of this embodiment, the substrate further includes a compositionally graded layer disposed underneath the relaxed semiconductor layer. The graded layer may include at least one of a group II, a group III, a group IV, a group V, and a group VI element, for example, at least one of silicon and germanium. The graded layer can be graded to a concentration of greater than about 10% germanium and may have thickness ranging from about 0.5 μm to about 10.0 μm.

The strained semiconductor layer may be tensilely strained, and may include, for example, a tensilely strained silicon or tensilely strained silicon-germanium alloy. In another embodiment, the strained semiconductor layer is compressively strained, and includes, for example, compressively strained germanium or compressively strained silicon-germanium alloy. The strained layer may have a thickness ranging from about 50 Å to about 1000 Å, for example, not exceeding about 300 Å. In a particular embodiment, the thickness of the strained layer does not exceed about 200 Å.

In various embodiments, thickness of the strained semiconductor is substantially unchanged following the deposition of the pad oxide layer. The pad oxide layer can be deposited by, for example, chemical vapor deposition. The pad oxide layer may include silicon dioxide, silicon oxynitride, silicon germanium oxide, or germanium oxide, and have thickness ranging from about 50 Å to about 500 Å.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

In accordance with various embodiments of the present invention, layers deposited on semiconductor substrates replace traditionally grown layers, thereby reducing the consumption of substrate surface material. Various features of the invention are well suited to applications utilizing MOS devices that include, for example, Si, $Si_{1-x}Ge_x$, and/or Ge layers in and/or on a substrate. The term "MOS" is used herein to refer generally to semiconductor devices that include a conductive gate spaced at least by an insulating layer from a semiconducting channel layer. The terms "SiGe," "$Si_{1-x}Ge_x$," and "$Si_{1-y}Ge_y$" refer to silicon-germanium alloys.

Figure 1A:
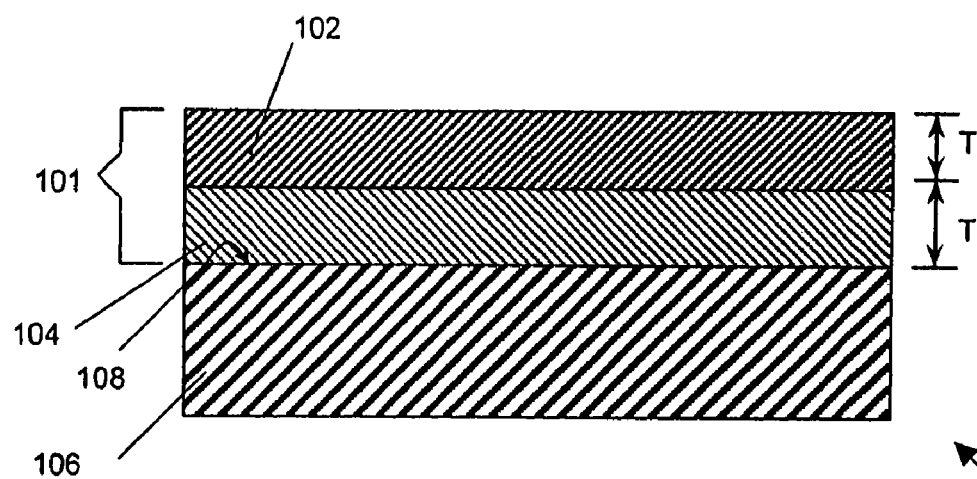
FIGS. 1A-1D depict schematic cross-sectional views of several substrates suitable for fabrication of semiconductor structures according to the embodiments of the invention.

Referring to FIG. 1A, which illustrates an epitaxial wafer 100 suitable to use with the present invention, several layers collectively indicated at 101, including a strained layer 102 and a relaxed layer 104, are disposed over a substrate 106. The substrate 106 comprises a semiconductor, such as silicon, silicon deposited over an insulator, such as, for example, $SiO_2$, or a silicon-germanium alloy. In one embodiment, the layers 101 are epitaxially grown over the substrate 106. In this embodiment, the layers 101 and the substrate 106 may be referred to together as a "virtual substrate."

The ensuing discussion focuses on a strained layer 102 that is tensilely strained, but it is understood that the strained layer 102 may be tensilely or compressively strained. The strained layer 102 has a lattice constant other than the equilibrium lattice constant of the material from which it is formed, and it may be tensilely or compressively strained; the relaxed layer 104 has a lattice constant equal to the equilibrium lattice constant of the material from which it is formed. The tensilely strained layer 102 shares an interface 108 with the relaxed layer 104.

The substrate 106 and the relaxed layer 104 may be formed from various materials systems, including various combinations of group II, group III, group IV, group V, and group VI elements. For example, each of the substrate 106 and the relaxed layer 104 may include a III-V compound. The substrate 106 may include gallium arsenide (GaAs), and the relaxed layer 104 may include indium gallium arsenide (InGaAs) or aluminum gallium arsenide (AlGaAs). These examples are merely illustrative, and many other material systems are suitable.

In various embodiments, the relaxed layer 104 may include $Si_{1-x}Ge_x$ with a uniform composition, containing, for example, Ge in the range $0.1 \leq x \leq 0.9$ and having a thickness $T_1$ of, e.g., 0.2-2 μm. In one particular embodiment, $T_1$ is about 1.5 μm.

The strained layer 102 may include a semiconductor such as at least one of a group II, a group III, a group IV, a group V, and a group VI element. The strained semiconductor layer 102 may include, for example, Si, Ge, SiGe, GaAs, indium phosphide (InP), and/or zinc selenide (ZnSe). In some embodiments, the strained semiconductor layer 102 may include approximately 100% Ge, and may be compressively strained. A strained semiconductor layer 102 comprising 100% Ge may be formed over, e.g., the relaxed layer 104 containing uniform $Si_{1-x}Ge_x$ having a Ge content of, for example, 50-90% (i.e., x=0.5-0.9), preferably 70% (i.e., x=0.7).

In various embodiments, tensilely strained layer 102 is formed of silicon. The tensilely strained layer 102 has a thickness $T_2$ of, for example, 50-1000 Å. In a particular embodiment, thickness $T_2$ is less than about 300 Å, preferably below 200 Å. In embodiments in which the strained layer 102 includes materials other than silicon, a thin silicon cap layer may be disposed over strained layer 102. This silicon cap layer may have a thickness of, for example, between about 5 Å and about 50 Å.

The epitaxially grown layers 101, including the relaxed layer 104 and strained layer 102, can be grown in any suitable epitaxial deposition system, including, but not limited to, atmospheric-pressure CVD (APCVD), low- (or reduced-) pressure CVD (LPCVD), ultra-high-vacuum CVD (UH-VCVD), by molecular beam epitaxy (MBE), or by atomic layer deposition (ALD). The epitaxial growth system may be a single-wafer or multiple-wafer batch reactor. The growth system also may utilize low-energy plasma to enhance the layer growth kinetics.

Suitable CVD systems commonly used for volume epitaxy in manufacturing applications include, for example, EPI CENTURA single-wafer multi-chamber systems available from Applied Materials of Santa Clara, Calif., or EPSILON single-wafer epitaxial reactors available from ASM International based in Bilthoven, The Netherlands.

In the CVD process, obtaining epitaxial growth typically involves introducing a source gas into the chamber. The source gas may include at least one precursor gas and a carrier gas, such as, for example hydrogen. In those embodiments of the invention where the layers are formed from Si, silicon precursor gases such as, for example, silane, disilane, trisilane, or dichlorosilane DCS) trichlorosilane (TCS), or silicon tetrachloride may be used. Conversely, in those embodiments of the invention where the layers are formed from Ge, germanium precursor gases, such as, for example, germane ($GeH_4$), digermane, germanium tetrachloride, or dichlorogermane, or other Ge-containing precursors may be used. Finally, in the embodiments where the layers are formed from SiGe alloy, a combination of silicon and germanium precursor gases in various proportions is used.

In an embodiment in which the strained layer 102 contains substantially 100% Si, the strained layer 102 may be formed in a dedicated chamber of a deposition tool that is not exposed to Ge source gases, thereby avoiding cross-contamination and improving the quality of the interface 108 between the strained layer 102 and the relaxed layer 104. Furthermore, the strained layer 102 may be formed from an isotopically pure silicon precursor(s). Isotopically pure Si has better thermal conductivity than conventional Si. Higher thermal conductivity may help dissipate heat from devices subsequently formed on the strained layer 102, thereby maintaining the enhanced carrier mobilities provided by the strained layer 102.

In various embodiments, relaxed layer 104 and/or strained layer 102 may be planarized or smoothed to improve the quality of subsequent wafer bonding. Planarization or smoothing may be accomplished by CMP or in situ epitaxy-based methods, for example, although other techniques are acceptable as well. Following planarization, the relaxed layer 104 may have a surface roughness less than 1 nm, and the strained layer 102 may have a surface roughness, e.g., less than 0.5 nanometer (nm) root mean square (RMS).

Figure 1B:
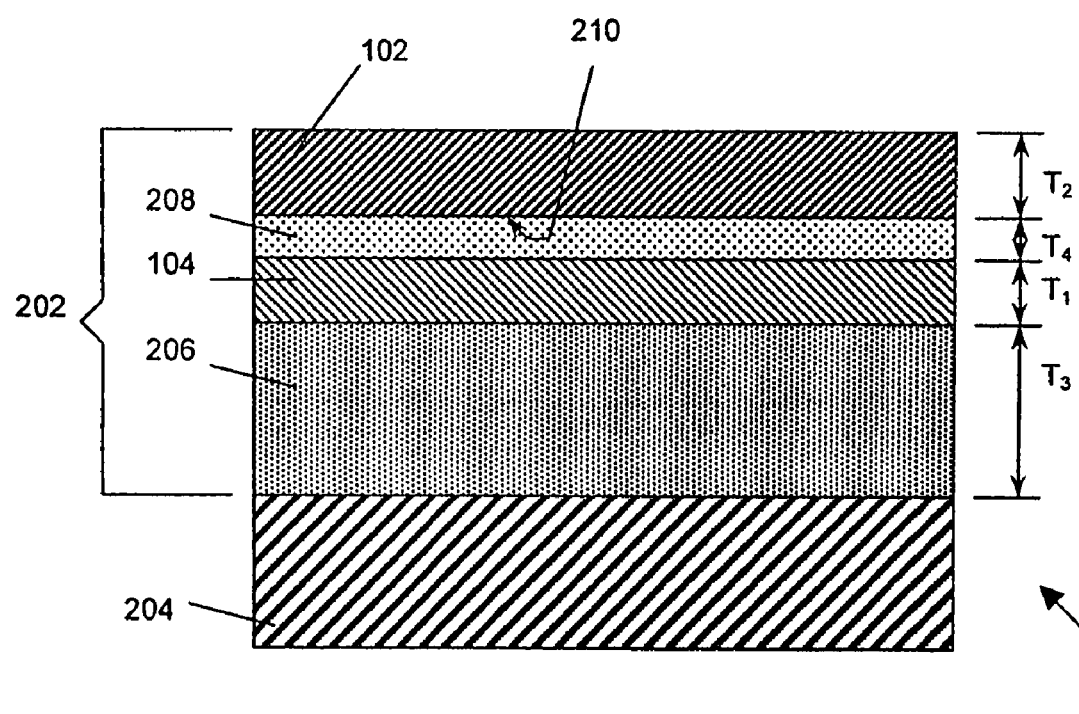

Referring to FIG. 1B, in another embodiment, an epitaxial wafer 200 amenable for use with the present invention may include layers in addition to those indicated in FIG. 1A. In this embodiment, several layers collectively indicated at 202 are disposed over a semiconductor substrate 204 formed from, e.g. silicon. The layers 202 may be epitaxially grown by, for example, APCVD, LPCVD, or UHVCVD. The layers 202 and the substrate 204 may be referred to together as a "virtual substrate."

The layers 202 include a graded layer 206 having a thickness $T_3$ ranging from about 0.1 μm to about 10 μm, is disposed over substrate 204. The relaxed layer 104 described above is disposed over the graded layer 206.

In one embodiment, the graded layer 206 includes Si and Ge with a grading rate of, for example, 10% Ge per μm of thickness, and a thickness ranging from about 2 μm to about 9 μm. In another embodiment, the graded layer 206 includes Si and Ge with a grading rate of, for example, over about 5% Ge per μm of thickness, and generally in the range of >5% Ge/μm to 100% Ge/μm, preferably between 5% Ge/μm and 50% Ge/μm, to a final Ge content of between about 10% to about 100% Ge. While the overall grading rate of the graded layer is generally defined as the ratio of total change in Ge content to the total thickness of the layer, a "local grading rate" within a portion of the graded layer may be different from the overall grading rate. For example, a graded layer including a 1 μm region graded from 0% Ge to 10% Ge (a local grading rate of 10% Ge/μm) and a 1 μm region graded from 10% Ge to 30% Ge (a local grading rate of 20% Ge/μm) will have an overall grading rate of 15% Ge/μm. Thus, a relaxed graded layer may not necessarily have a linear profile, but may comprise smaller regions having different local grading rates. In various embodiments, the graded layer 206 is grown, for example, at 600-1200° C. Higher growth temperatures, for example, exceeding 900° C. may be preferred to enable faster growth rates while minimizing the nucleation of threading dislocations. See, generally, U.S. Pat. No. 5,221,413, incorporated herein by reference in its entirety.

Still referring to FIG. 1B, in some embodiments, a compressively strained layer 208 including a semiconductor material is disposed over the relaxed layer 104. In one embodiment, the compressively strained layer 208 includes group IV elements, such as $Si_{1-y}Ge_y$, with a Ge content (y) higher than the Ge content (x) of the relaxed ($Si_{1-x}Ge_x$) cap layer, for example, in the range $0.25 \leq y \leq 1$. The compressively strained layer 208 may contain, for example, 1-100% Ge, preferably over 40% Ge, and may have a thickness $T_4$ ranging from about 10 to about 500 angstroms (Å), preferably below 200 Å. In some embodiments, the compressively strained layer 208 includes at least one group III and one group V element, e.g., indium gallium arsenide, indium gallium phosphide, or gallium arsenide. In alternative embodiments, the compressively strained layer 160 includes at least one group II and one group VI element, e.g., zinc selenide, zinc sulfide, cadmium telluride, or mercury telluride.

Still referring to FIG. 1B, in one embodiment, the tensilely strained layer 102 is disposed over the compressively strained layer 208, sharing an interface 210 therewith. In another embodiment, the compressively strained layer 208 may be disposed not under, but over the tensilely strained layer 102. Alternatively, in yet another embodiment, there is no compressively strained layer 208 and instead the tensilely strained layer 102 is disposed over the relaxed layer 104, sharing an interface therewith. In still another embodiment, a relaxed constant-composition regrowth layer (not shown) is disposed over the relaxed layer 104, sharing an interface therewith, and a tensilely strained layer is disposed over the constant-composition regrowth layer, sharing an interface with that layer. The regrowth layer may, for example, include $Si_{1-x}Ge_x$ with a uniform composition, containing, e.g., 1-100% Ge and having a thickness of, for example, 0.01-2 μm.

In various embodiments, the substrate 206 with layers 202 disposed thereon has a threading dislocation density of $10^4$-$10^5$ cm$^{-2}$.

Figure 1C:
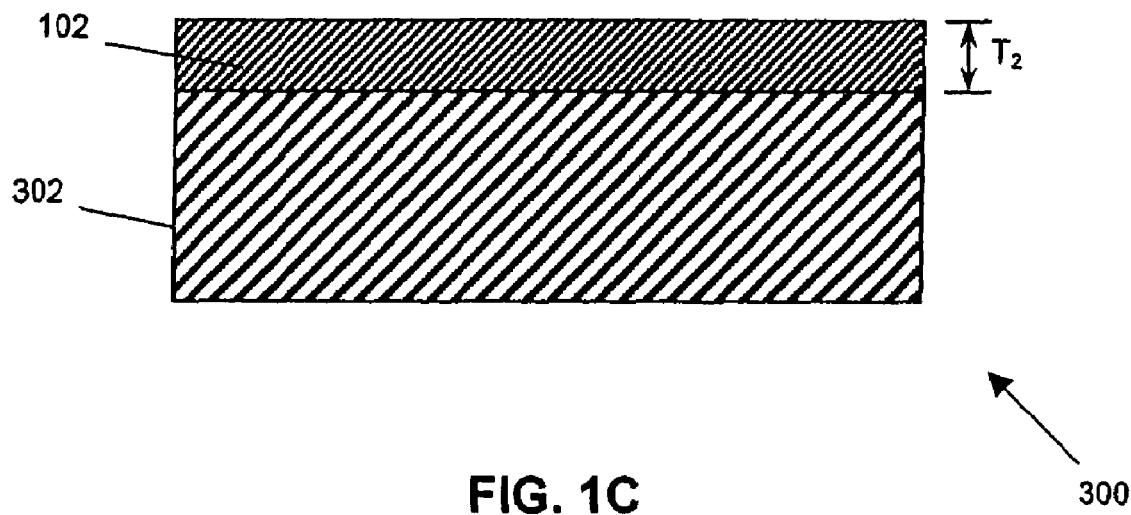

Referring to FIG. 1C, in yet another embodiment, an epitaxial wafer 300 amenable for use with the present invention is a strained-semiconductor-on-semiconductor SSOS substrate 302, having a strained layer 102 disposed in contact with a crystalline semiconductor handle wafer. The handle wafer may include a bulk semiconductor material, such as silicon. The strain of the strained layer 102 is not induced by underlying handle wafer 310, and is independent of any lattice mismatch between the strained layer 102 and the handle wafer 310. In a particular embodiment, the strained layer 102 and the handle wafer 310 include the same semiconductor material, e.g., silicon. The handle wafer 310 may have a lattice constant equal to a lattice constant of the strained layer 102 in the absence of strain. The strained layer 102 may have a strain greater than approximately $10^{-3}$. The strained layer 102 may have been formed by epitaxy, and may have a thickness T2 ranging from approximately 20 Å to approximately 1000 Å, with a thickness uniformity of better than approximately ±10%. In various embodiments, the strained layer 102 may have a thickness uniformity of better than approximately ±5%. The strained layer 102 may have a surface roughness of less than 20 Å.

The SSOS substrate 302 may be formed, as described in U.S. Ser. Nos. 10/456,708, 10/456,103, 10/264,935, and 10/629,498, the entire disclosures of each of the four applications being incorporated herein by reference. The SSOS substrate formation process-may include the formation of the strained layer 102 over the substrate 106 as described above with reference to FIG. 1A. A cleave plane may be defined in, e.g., the relaxed layer 104. The strained layer 102 may be bonded to the handle wafer 310, and a split may be induced at the cleave plane. Portions of the relaxed layer 104 remaining on the strained layer 102 may be removed by, e.g., oxidation and/or wet etching.

Figure 1D:
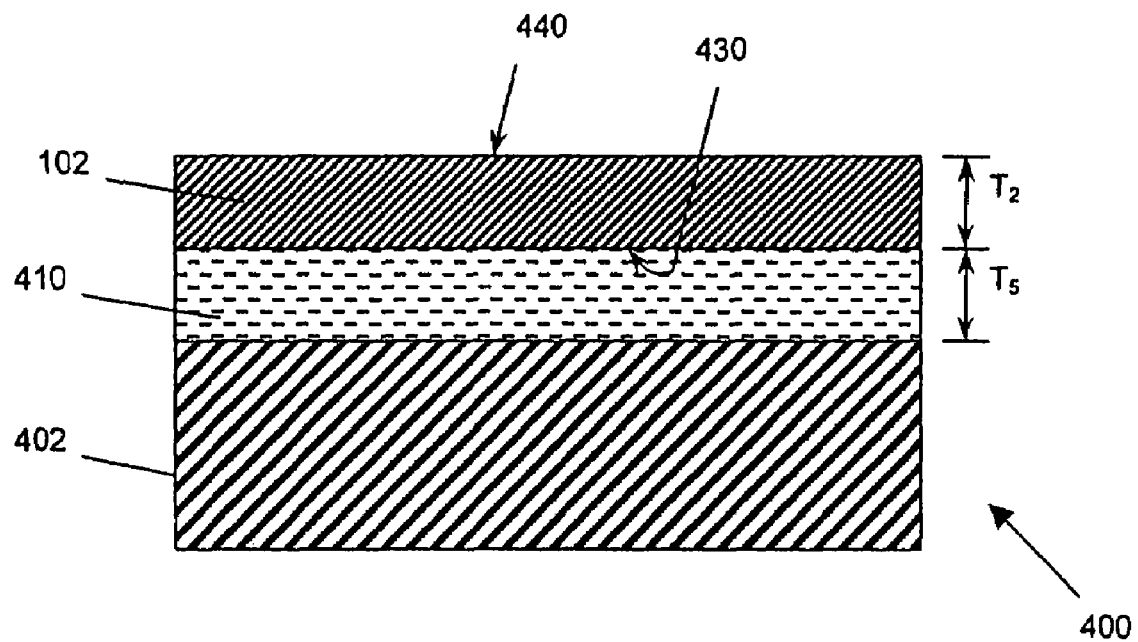

Yet another epitaxial wafer suitable for use with the present invention is a strained-semiconductor-on-insulator (SSOI) wafer 400. Referring to FIG. 1D, a SSOI wafer 400 has the strained layer 102 disposed over an insulator, such as a dielectric layer 410 formed on a semiconductor substrate 402. The SSOI wafer 400 may be formed by methods analogous to the methods described above in the formation of the SSOS wafer 300. The dielectric layer 410 may include, for example, $SiO_2$. In one embodiment, the dielectric layer 410 includes a material having a melting point ($T_m$) higher than a $T_m$ of pure $SiO_2$, i.e., higher than 1700° C. Examples of such materials include silicon nitride ($Si_3N_4$), aluminum oxide, and magnesium oxide. In another embodiment, the dielectric layer 410 includes a high-k material with a dielectric constant higher than that of $SiO_2$, such as aluminum oxide ($Al_2O_3$), hafnium oxide ($HfO_2$) or hafnium silicate (HfSiON or $HfSiO_4$). The semiconductor substrate 402 includes a semiconductor material such as, for example, Si, Ge, or SiGe. The strained layer 102 has a thickness $T_2$ ranging, for example, from about 50 to about 1000 Å, with a thickness uniformity of better than approximately ±5% and a surface roughness of less than approximately 20 Å. The dielectric layer 410 has a thickness $T_5$ selected from a range of, for example, 500-3000 Å. In an embodiment, the strained layer 102 includes approximately 100% Si or 100% Ge having one or more of the following material characteristics: misfit dislocation density of, e.g., 0-$10^5$ $cm^{-1}$; a threading dislocation density of about 10-$10^7$ dislocations/$cm^2$; a surface roughness of approximately 0.01-1 nm RMS; and a thickness uniformity across the SOI substrate 400 of better than approximately ±10% of a mean desired thickness; and a thickness $T_2$ of less than approximately 200 Å. In an embodiment, the SSOI substrate 400 has a thickness uniformity of better than approximately ±5% of a mean desired thickness.

In one embodiment, the dielectric layer 410 has a $T_m$ greater than that of $SiO_2$. During subsequent processing, e.g., MOSFET formation, SSOI substrate 400 may be subjected to high temperatures, i.e., up to 1100° C. High temperatures may result in the relaxation of strained layer 102 at an interface 430 between strained layer 102 and dielectric layer 410. The use of dielectric layer with a $T_m$ greater than 1700° C. may help keep strained layer 102 from relaxing at the interface 430 between strained layer 102 and dielectric layer 410 when the SSOI substrate is subjected to high temperatures.

In one embodiment, the misfit dislocation density of the strained layer 102 may be lower than its initial misfit dislocation density. The initial dislocation density may be lowered by, for example, performing an etch of a top surface 440 of the strained layer 102. This etch may be a wet etch, such as a standard microelectronics clean step such as an RCA SC1, i.e., hydrogen peroxide, ammonium hydroxide, and water ($H_2O_2$+$NH_4OH$+$H_2O$), which at, e.g., 80° C. may remove silicon.

Figure 2A:
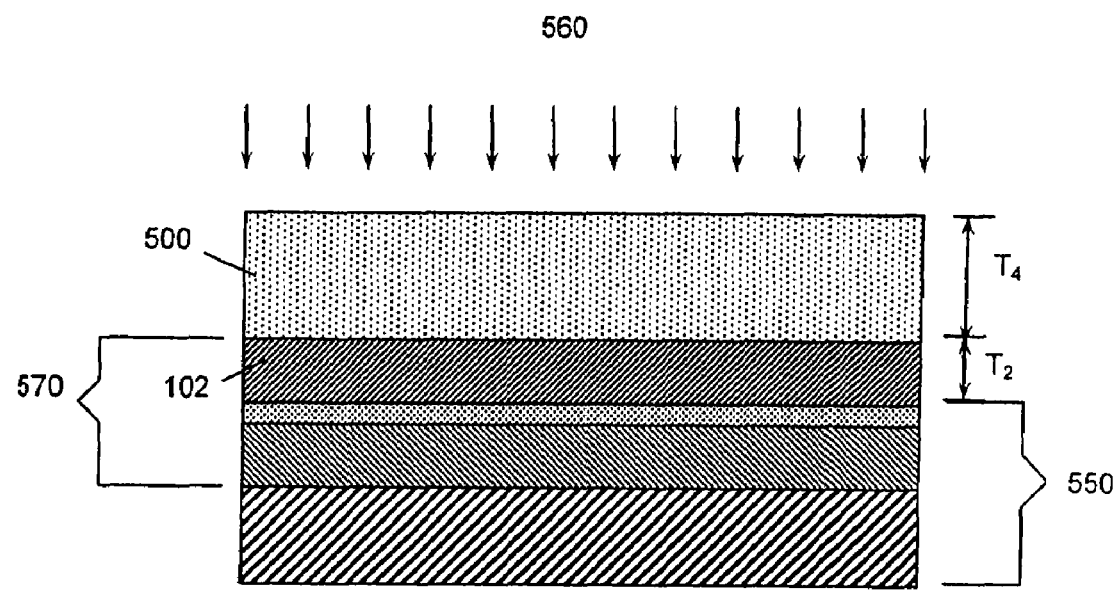
FIGS. 2A-2B depict schematic cross-sectional views of a semiconductor substrate having a screening layer formed thereon according to the embodiments of the invention.

Referring to FIG. 2A, in one embodiment of the invention, a screening layer 500 is formed over the strained layer 102 of the semiconductor wafer 550. The wafer 550 can be any one of the wafers 100, 200, 300, or 400 described above. The screening layer 500 may include an oxygen-containing dielectric layer, for example, an oxide layer, including, but not limited to, silicon dioxide (($SiO_2$), silicon oxynitride (nitrided ($SiO_2$), silicon germanium oxide ($SiGeO_2$), aluminum oxide ($Al_2O_3$), or germanium oxide ($GeO_2$), having a thickness $T_4$ ranging from about 20 Å to about 300 Å. In one embodiment, the screening layer 500 may be another dielectric material, such as silicon nitride or a high-k dielectric material. In various embodiments, the screening layer 500 is formed by deposition, including CVD, such as, for example, APCVD, LPCVD, or PECVD, or by physical deposition methods, such as sputtering. In another embodiment, the screening layer 500 is formed by atomic layer deposition (ALD). The formation of screening layer 500 by deposition, rather than by conventional growth processes, substantially avoids the undesirable consumption of the material of the strained layer 102 by the screening layer 20 during formation thereof.

After the formation of screening layer 500, dopants 560 may be introduced into component layers 570 of the wafer 550 to form features such as n-wells or p-wells in, e.g., the strained layer 102 and relaxed layer 104 shown in FIG. 1A, for CMOS devices. The dopants 560 may be n-type or p-type. For example, in an embodiment in which strained layer 102 includes group IV material such as Si, n-type dopants, for example, arsenic (As), phosphorus (P), or antimony (Sb) may be used. Alternatively, p-type dopants may include boron (B) or indium (In). The dopants 560 may be introduced by ion implantation. During ion implantation, the screening layer 500 provides improved protection against contamination by particles, including metal particles. Further, the screening layer 500 affects the introduction of dopants 560 by scattering them during implantation, thereby reducing the probability of ion channeling. Following the introduction of dopants 560, the wafer 550 may be annealed. During the annealing step, the screening layer 500 hinders out-diffusion of dopants 560 from the layers 570.

Figure 2B:
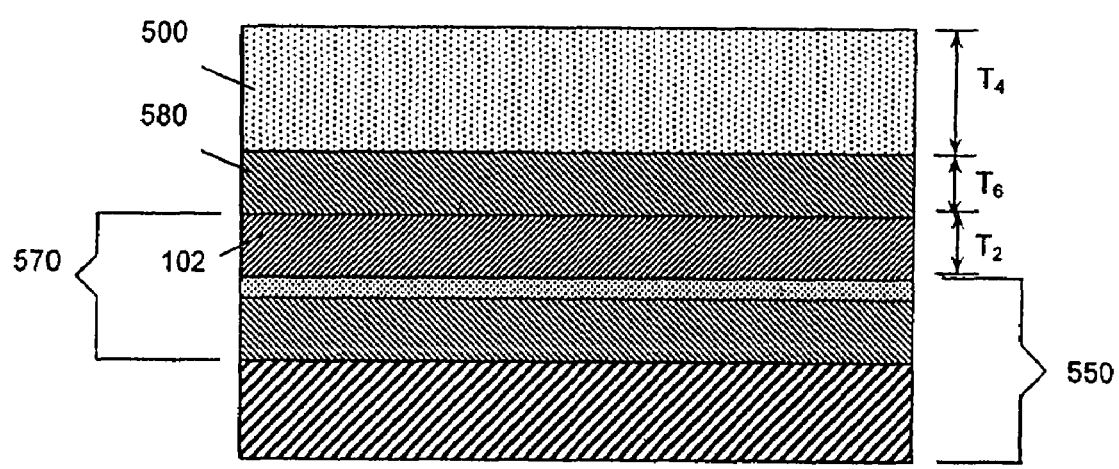

Referring to FIG. 2B, in an alternative embodiment, an oxide layer 580 may be grown on the strained layer 102 by, e.g., rapid thermal oxidation, prior to the formation of the screening layer 500. The oxide layer 580 may include, for example, $SiO_2$, nitrided $SiO_2$, $SiGeO_2$, or $GeO_2$, and may have a relatively small thickness $T_6$, e.g., ranging from about 5 Å to about 30 Å. Because the oxide layer 580 is relatively thin, its growth does not consume an excessive amount of the strained layer 102. An oxide layer, when grown on silicon, typically consumes a silicon thickness equal to approximately one-half of the thickness of the oxide grown. For example, if the strained layer 102 is predominantly Si, then the growth of the oxide layer 580 with a thickness $T_5$ of 20 Å consumes approximately 10 Å of the strained layer 102. The growth of the oxide layer 580 prior to the formation of screening layer 500 may be desirable in some embodiments. For example, the oxide layer 580 may provide a clean protective coating to strained layer 102, prior to CVD, a process that may be not as clean as a conventional thermal growth process.

In some embodiments, the screening layer 500 may be formed at other points during device processing. For example, the screening layer 500 may be formed prior to a source and drain implantation, or prior to a threshold implantation before gate dielectric formation.

Figure 3A:
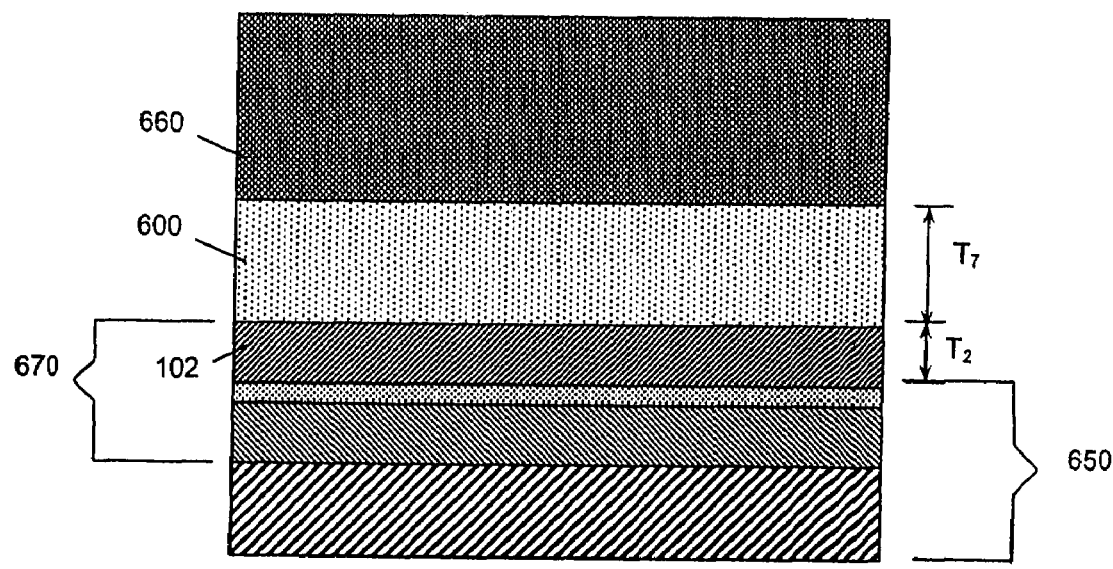
FIGS. 3A-3B depict schematic cross-sectional views of a semiconductor substrate having a pad oxide layer formed thereon according to the embodiments of the invention.

Referring to FIG. 3A, in yet another embodiment, a pad oxide layer 600 is formed over the strained layer 102 of the semiconductor wafer 650 as part of the STI process whereby the pad oxide layer 600 is used as a stress-mediating underlayer beneath a silicon nitride trench mask layer for STI formation. The wafer 650 can be any one of the wafers 100, 200, 300, or 400 described above with reference to FIGS. 1A-1D. The pad oxide layer 600 may be formed by, for example, CVD, such as APCVD, PECVD, LPCVD, or high-density plasma (HDP) deposition. The pad oxide layer 600 may include an oxide such as $SiO_2$, nitrided $SiO_2$, $SiGeO_2$, or $GeO_2$, and may have a thickness $T_7$ of, e.g., between about 50 Å and about 500 Å. The formation of the pad oxide layer 600 by conventional thermal growth may consume approximately 25-250 Å of the underlying strained layer 102. In contrast, by depositing the pad oxide layer 600, substantially none of the underlying strained layer 102 is consumed.

In various embodiments, after the formation of the pad oxide layer 600, a masking layer 660 is formed thereover. The masking layer 660 may include a nitride layer, such as silicon nitride, and may be formed by CVD, such as LPCVD, PECVD, APCVD, or HDP CVD. The masking layer 600 may have a thickness $T_7$ ranging from about 500 Å to about 2000 Å. The formation of the pad oxide layer 600 prior to the formation of the masking layer 660 inhibits the formation of defects in the strained layer 102 due to stress between the masking layer 660 and the strained layer 102.

Subsequent steps may be performed to provide device isolation. The masking layer 660 and the pad oxide layer 600 may be patterned by photolithography and etching. After the masking layer 660 and the pad oxide layer 600 are patterned, exposed portions of the substrate 650 and the underlying-portions of its component layers 670 ate etched to define trenches (not shown). A liner oxide may be formed by oxidation or deposition, and the trenches filled with a deposited dielectric to complete STI formation.

Figure 3B:
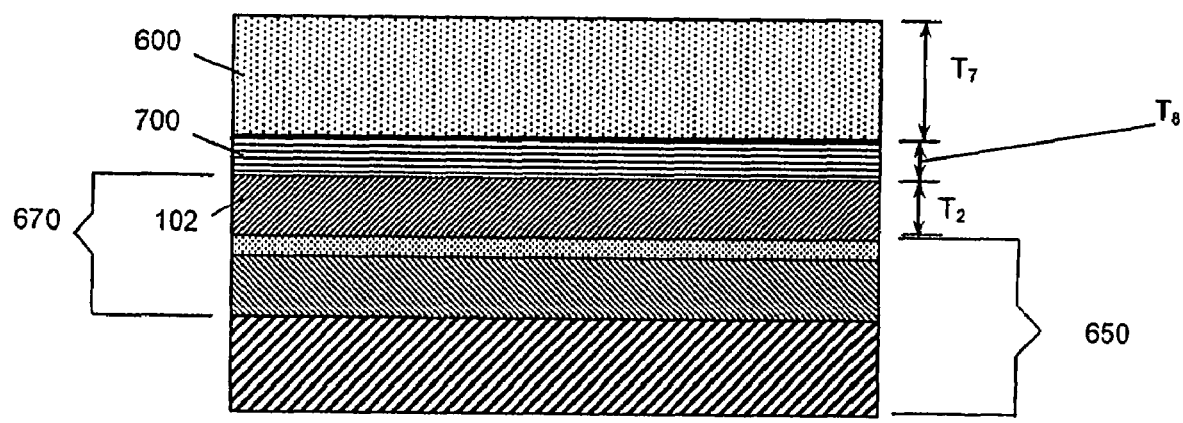

Referring to FIG. 3B, in still another embodiment, the oxide layer 700 may be grown by, e.g., rapid thermal oxidation on the strained layer 102 prior to the formation of the pad oxide layer 600. The oxide layer 700 may include, for example, $SiO_2$, $SiGeO_2$, or $GeO_2$, and may have a relatively small thickness $T_8$, e.g., ranging between about 5 Å and about 30 Å. Because the oxide layer 700 is relatively thin, its growth does not consume an excessive amount of the strained layer 102. By thermally growing the oxide layer 700 prior to depositing the pad oxide layer 600, the strained layer 102 is protected from potentially unclean deposition processing.

The structures illustrated in the above figures may be further processed to form devices, such as n-type metal-oxide-semiconductor field-effect transistors (nMOSFETs), p-type MOSFETs (pMOSFETs), and CMOS devices.

The invention may be embodied in other specific forms without departing from the spirit of essential characteristics thereof. The foregoing embodiments are therefore to be considered in all respects illustrative rather than limiting on the invention described herein.

What is claimed is:

1. A method for forming a semiconductor structure, the method comprising:
    forming a semiconductor structure comprising a strained semiconductor layer over a substrate, the strained semiconductor layer comprising at least one III-V compound;
    depositing a screening layer over at least a portion of a top surface of the strained semiconductor layer, the screening layer comprising an oxide; and
    introducing at least one of n-type or p-type dopants into the semiconductor structure through the screening layer, the screening layer affecting the introduction of the dopants into at least a portion of the structure by at least one of scattering dopants or reducing energy of the dopants,
    wherein the substrate comprises a relaxed semiconductor layer disposed underneath the strained semiconductor layer.

2. The method of claim 1 wherein the relaxed semiconductor layer comprises a III-V compound.

3. The method of claim 2 wherein the relaxed semiconductor layer comprises at least one of indium gallium arsenide or aluminum gallium arsenide.

4. The method of claim 1 wherein the substrate further comprises a compositionally graded layer disposed underneath the relaxed semiconductor layer.

5. The method of claim 1, further comprising processing the substrate to form a CMOS device thereover, the CMOS device having a channel disposed in the strained semiconductor layer.

6. A method for forming a semiconductor structure, the method comprising:
    forming a semiconductor structure comprising a strained semiconductor layer over a substrate, the strained semiconductor layer comprising at least one III-V compound;
    depositing a screening layer over at least a portion of a top surface of the strained semiconductor layer, the screening layer comprising an oxide;
    introducing at least one of n-type or p-type dopants into the semiconductor structure through the screening layer, the screening layer affecting the introduction of the dopants into at least a portion of the structure by at least one of scattering dopants or reducing energy of the dopants; and
    subjecting the structure to a thermal anneal,
    wherein the screening layer hinders out-diffusion of the dopants from at least a portion of the substrate.

7. The method of claim 6, further comprising processing the substrate to form a CMOS device thereover, the CMOS device having a channel disposed in the strained semiconductor layer.

8. A method for forming a semiconductor structure, the method comprising:
    forming a semiconductor structure comprising a strained semiconductor layer over a substrate, the strained semiconductor layer comprising at least one III-V compound;
    depositing a screening layer over at least a portion of a top surface of the strained semiconductor layer, the screening layer comprising an oxide;
    introducing at least one of n-type or p-type dopants into the semiconductor structure through the screening layer, the screening layer affecting the introduction of the dopants into at least a portion of the structure by at least one of scattering dopants or reducing energy of the dopants; and
    prior to depositing the screening layer, growing an oxide layer over the portion of the top surface of the strained semiconductor layer.

9. The method of claim 8 wherein the oxide layer is grown by a rapid thermal oxidation.

10. The method of claim 9 wherein a thickness of the oxide layer ranges from about 5 Å to about 30 Å.

11. The method of claim 8, further comprising processing the substrate to form a CMOS device thereover, the CMOS device having a channel disposed in the strained semiconductor layer.

12. A method for forming a semiconductor structure, the method comprising:
    forming a semiconductor layer over a substrate, the semiconductor layer comprising at least one III-V compound;
    depositing a screening layer over at least a portion of a top surface of the semiconductor layer, the screening layer comprising an oxide;
    introducing at least one of n-type or p-type dopants into the semiconductor structure through the screening layer, the screening layer affecting the introduction of the dopants into at least a portion of the structure by at least one of scattering dopants or reducing energy of the dopants; and
    processing the substrate to form a CMOS device thereover, the CMOS device having a strained channel disposed in the semiconductor layer.

13. The method of claim 12 wherein the substrate comprises at least one of silicon, germanium, or a III-V compound.

14. The method of claim 12 wherein the semiconductor layer has a thickness selected from a range of about 50 Å to about 1000 Å.

15. The method of claim 14 wherein the thickness of the semiconductor layer is less than or equal to about 300 Å.

16. The method of claim 14 wherein the thickness of the semiconductor layer is substantially unchanged after the deposition of the screening layer.

17. The method of claim 12 wherein the substrate comprises an insulating layer disposed underneath the semiconductor layer.

18. The method of claim 12 wherein the step of depositing the screening layer comprises chemical vapor deposition.

19. The method of claim 12 wherein the screening layer comprises a material selected from the group consisting of silicon dioxide, silicon oxynitride, silicon germanium oxide, and germanium oxide.

20. The method of claim 12 wherein the strained channel is tensilely strained.

21. The method of claim 12 wherein the strained channel is compressively strained.

22. The method of claim 12, wherein introducing at least one of n-type or p-type dopants comprises source and drain implantation.

23. The method of claim 12, wherein introducing at least one of n-type or p-type dopants comprises threshold implantation.

24. The method of claim 23, wherein processing the substrate to form a CMOS device comprises forming a gate dielectric after threshold implantation.

25. A method for forming a semiconductor structure, the method comprising:
  forming a semiconductor structure comprising a strained semiconductor layer over a substrate, the strained semiconductor layer comprising at least one III-V compound;
  depositing a screening layer over at least a portion of a top surface of the strained semiconductor layer, the screening layer comprising an oxide;
  introducing at least one of n-type or p-type dopants into the semiconductor structure through the screening layer, the screening layer affecting the introduction of the dopants into at least a portion of the structure by at least one of scattering dopants or reducing energy of the dopants; and
  forming a silicon layer over the strained semiconductor layer prior to depositing the screening layer.

26. The method of claim 25 wherein the silicon layer has a thickness between approximately 5 Å and approximately 50 Å.

27. The method of claim 25, further comprising processing the substrate to form a CMOS device thereover, the CMOS device having a channel disposed in the strained semiconductor layer.

28. A method for forming a semiconductor structure, the method comprising:
  forming a semiconductor structure comprising a strained semiconductor layer over a substrate, the strained semiconductor layer comprising at least one III-V compound;
  depositing a screening layer over at least a portion of a top surface of the strained semiconductor layer, the screening layer comprising an oxide; and
  introducing at least one of n-type or p-type dopants into the semiconductor structure through the screening layer, the screening layer affecting the introduction of the dopants into at least a portion of the structure by at least one of scattering dopants or reducing energy of the dopants,
  wherein the screening layer comprises aluminum oxide.

29. The method of claim 28, further comprising processing the substrate to form a CMOS device thereover, the CMOS device having a channel disposed in the strained semiconductor layer.

30. A method for forming a semiconductor structure, the method comprising:
  forming a semiconductor structure comprising a strained semiconductor layer over a substrate, the strained semiconductor layer comprising at least one III-V compound;
  depositing a screening layer over at least a portion of a top surface of the strained semiconductor layer, the screening layer comprising an oxide; and
  introducing at least one of n-type or p-type dopants into the semiconductor structure through the screening layer, the screening layer affecting the introduction of the dopants into at least a portion of the structure by at least one of scattering dopants or reducing energy of the dopants,
  wherein the screening layer comprises a high-k dielectric material.

31. The method of claim 30, further comprising processing the substrate to form a CMOS device thereover, the CMOS device having a channel disposed in the strained semiconductor layer.

* * * * *